(12) United States Patent
Woo et al.

(10) Patent No.: US 9,741,861 B2
(45) Date of Patent: Aug. 22, 2017

(54) DISPLAY DEVICE AND METHOD FOR MANUFACTURING THE SAME

(71) Applicant: LG DISPLAY CO., LTD., Seoul (KR)

(72) Inventors: Changseung Woo, Goyang-si (KR); Soonhwan Hong, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/789,459

(22) Filed: Jul. 1, 2015

(65) Prior Publication Data

US 2016/0043229 A1 Feb. 11, 2016

(30) Foreign Application Priority Data

Aug. 6, 2014 (KR) ........................ 10-2014-0101325

(51) Int. Cl.
*H01L 29/786* (2006.01)
*H01L 29/66* (2006.01)
*H01L 27/12* (2006.01)
*H01L 27/32* (2006.01)
*H01L 29/24* (2006.01)

(52) U.S. Cl.
CPC ........ *H01L 29/7869* (2013.01); *H01L 27/124* (2013.01); *H01L 27/1248* (2013.01); *H01L 27/1259* (2013.01); *H01L 27/3248* (2013.01); *H01L 27/3258* (2013.01); *H01L 29/24* (2013.01); *H01L 29/66969* (2013.01)

(58) Field of Classification Search
None
See application file for complete search history.

(56) References Cited

U.S. PATENT DOCUMENTS

| 2011/0127531 | A1 | 6/2011 | Kim |
| 2013/0126876 | A1 | 5/2013 | Shin et al. |
| 2014/0070240 | A1* | 3/2014 | Zhou ..................... H01L 29/458 257/88 |
| 2014/0138714 | A1 | 5/2014 | Chen et al. |
| 2014/0145181 | A1* | 5/2014 | Yamazaki .............. H02H 9/044 257/43 |
| 2014/0145195 | A1 | 5/2014 | Kim et al. |
| 2014/0159059 | A1 | 6/2014 | Jeong et al. |
| 2015/0349098 | A1* | 12/2015 | Yu ..................... H01L 29/41733 438/104 |

FOREIGN PATENT DOCUMENTS

EP 2657969 A2 10/2013

\* cited by examiner

*Primary Examiner* — Tom Thomas
*Assistant Examiner* — Steven B Gauthier
(74) *Attorney, Agent, or Firm* — Dentons US LLP

(57) ABSTRACT

A display device and a method for manufacturing the same having a thin film transistor (TFT) including a gate connected to a gate line, a drain connected to a data line, and a source connected to a pixel electrode and a passivation layer only in an opening of a pixel and a peripheral area of the TFT. The pixel electrode directly contacts the source of the TFT and overlaps the gate of the TFT.

15 Claims, 17 Drawing Sheets

DISPLAY DEVICE AND METHOD FOR MANUFACTURING THE SAME

This application claims the benefit of Korean Patent Application No. 10-2014-0101325 filed on Aug. 6, 2014, which is incorporated in its entirety by reference for all purposes as if fully set forth herein.

BACKGROUND

Field of the Disclosure

Embodiments of the invention relate to a display device including an oxide semiconductor thin film transistor (TFT) and a method for manufacturing the same.

Discussion of the Related Art

An electronic display device includes a thin film transistor (TFT) at each pixel so as to turn on a data voltage applied to the pixel or drive the pixel. An amorphous silicon TFT, polycrystalline silicon TFT, an oxide semiconductor TFT, etc, are known types of TFTs.

The oxide semiconductor TFT has mobility greater than the amorphous silicon TFT and can be manufactured in a low temperature process. Further, the oxide semiconductor TFT has an advantage of transparency and is capable of transmitting visible light. Thus, the oxide semiconductor TFT is suitable for a high resolution display device or a transparent display device.

One problem is that an oxide semiconductor material of the TFT dissolves easily in an acid solution. Thus, when a metal stacked on the oxide semiconductor material is wet etched, the oxide semiconductor may be damaged or degraded by the etchant. To avoid this, the metal stacked on the oxide semiconductor may be dry etched using plasma, for example. However, damage to the surface of the oxide semiconductor may be caused by the plasma used in the dry etching.

Another alternative to protect the oxide semiconductor is to form an etch stopper on the oxide semiconductor to prevent back etching of the oxide semiconductor layer of the TFT. However, a photomask process for forming the etch stopper has to be added during manufacture of the device. A photomask process is a photolithographic technology process for sequentially performing a series of steps including a thin film deposition process, a photoresist application process, a photomask alignment process, an exposure process, a development process, an etching process, a strip process, etc., to pattern a thin film. A reduction in the number of photomask processes results in a reduction in the manufacturing cost and an increase in device yield.

Also, a gate insulator may be formed of silicon oxide (SiOx) to prevent changes in characteristics of the oxide semiconductor TFT. However, it takes more time to perform a wet etching process and a dry etching process of silicon oxide (SiOx) than silicon nitride (SiNx), which is widely used as a gate insulator material. Therefore, a method for simultaneously etching the etch stopper and the gate insulator, each of which is formed of silicon oxide (SiOx), through the dry etching process may be considered. However, because it is highly likely that a photoresist pattern is degraded due to a long processing time, it is difficult to execute this method. Thus, a separate photomask process for patterning the gate insulator formed of silicon oxide (SiOx) is added to the device fabrication.

In a display driving circuit, a common voltage Vcom may be supplied to the pixels through a metal layer. In this instance, the metal has to be exposed so it can be contacted by etching the gate insulator covering the metal. When the gate insulator is formed of silicon oxide (SiOx), the gate insulator is etched through a separate photomask process.

A passivation layer covering the oxide semiconductor TFT may use an organic passivation material. The organic passivation layer may be formed of photoacryl. Also, a pixel electrode may be connected to a source of the oxide semiconductor TFT by etching a portion of the passivation layer at a position outside the oxide semiconductor TFT. However, this method has to form a hole to expose the pixel electrode to the organic passivation layer in an opening inside the pixel. The pixel opening being a transparent portion of the pixel that does not block light. Pixel portions that would block light include wiring and the TFT. Therefore, an additional process tolerance margin for forming the hole in the opening is necessary. The additional space needed for the margin leads to a reduction in an aperture ratio of the pixel.

SUMMARY

Embodiments of the invention provide a display device and a method for manufacturing the same capable of reducing the number of manufacturing processes and increasing an aperture ratio of a pixel as compared to the related art.

In one aspect, there is a display device comprising a thin film transistor (TFT) including a gate connected to a gate line, a drain connected to a data line, and a source connected to a pixel electrode; and a passivation layer only in an opening of a pixel and a peripheral area of the TFT. The pixel electrode directly contacts the source of the TFT and overlaps the gate of the TFT.

In another aspect, there is a display device comprising a first metal including a gate line, a gate of a thin film transistor (TFT) connected to the gate line, and a contact electrode; a gate insulator covering the gate of the TFT and the gate line and not the contact electrode; a second metal including a data line, a drain of the TFT connected to the data line, and a source of the TFT, on the gate insulator; a passivation layer including a first inorganic passivation layer on a portion of the second metal and the gate insulator, and an organic passivation layer on the first inorganic passivation layer, the passivation layer only in an opening of a pixel and a peripheral area of the TFT so that the TFT is exposed inside the pixel; a first oxide semiconductor in a channel region of the TFT, the first oxide semiconductor contacting the data line and the source and the drain of the TFT; a second oxide semiconductor contacting the contact electrode; a second inorganic insulator covering a portion of the first oxide semiconductor pattern and a portion of the second oxide semiconductor pattern; and a pixel electrode overlapping the second oxide semiconductor pattern on the second inorganic insulator, wherein the pixel electrode directly contacts the source of the TFT and overlaps the gate of the TFT or the gate line.

In yet another aspect, there is a method for manufacturing a display device comprising forming a gate line, a gate of a thin film transistor (TFT), and a contact electrode on a substrate; forming a gate insulator covering the gate line, the gate of the TFT, and the contact electrode; forming a data line, a source of the TFT, and a drain of the TFT on the gate insulator; exposing the contact electrode and the gate insulator in a channel region between the source and the drain of the TFT; forming a passivation layer, in which an inorganic passivation layer and an organic passivation layer are stacked, only in an opening of a pixel and a peripheral area of the TFT so that the TFT is exposed inside the pixel; forming an oxide semiconductor pattern in a channel region and a source-drain area of the TFT and the opening of the pixel, covering the TFT and the contact electrode with a photoresist, performing a first plasma process on the exposed oxide semiconductor to metalize the oxide semiconductor, and form a common electrode; forming an etch stopper covering the oxide semiconductor and the common electrode in the channel region of the TFT and performing a second plasma process to metalize an oxide semiconductor formed in the source-drain area of the TFT and an oxide semiconductor between the common electrode and the contact electrode; and forming a pixel electrode directly contacting the source of the TFT and overlapping the gate of the TFT or the gate line.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to embodiments of the invention, examples of which are illustrated in the accompanying drawings. Wherever possible, the same reference numbers will be used throughout the drawings to refer to the same or like parts. In the detailed description, known art will be omitted.

Figure 1A:
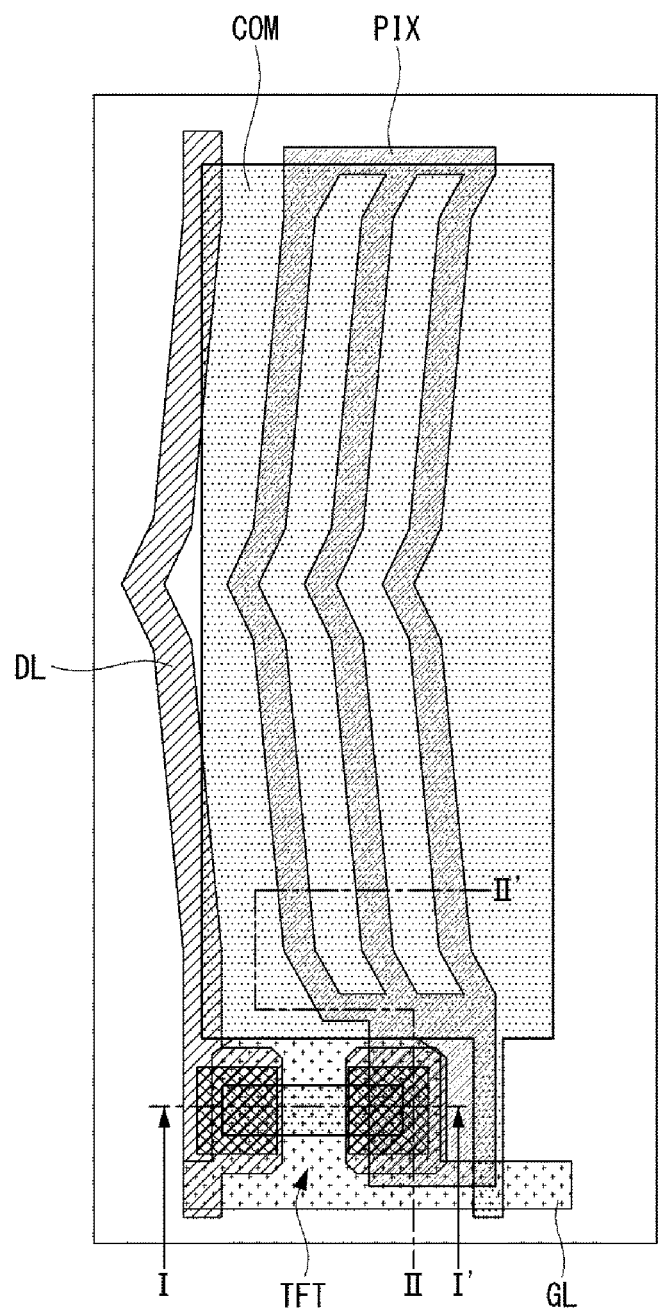
FIG. 1A is a plan view showing a pixel of a display device according to an exemplary embodiment of the invention.
Figure 1B:
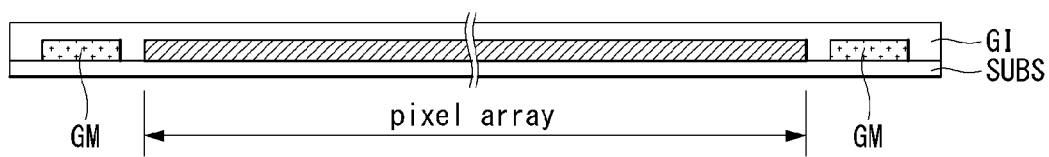
FIG. 1B is a cross-sectional view showing the pixel of a display device according to an exemplary embodiment of the invention.

Referring to FIGS. 1A and 1B, a pixel area of a display device according to an exemplary embodiment of the invention includes data lines DL, gate lines GL crossing the data lines DL, a thin film transistor (TFT) formed at a crossing of the data lines DL and the gate lines GL, a pixel electrode PIX connected to the TFT, and a common electrode COM to which a common voltage Vcom is supplied. In the embodiment disclosed herein, the TFT is an oxide semiconductor TFT. FIG. 1B illustrates a cross-section view showing a contact electrode GM outside a pixel array. Elements over the gate insulator GI are omitted for brevity in FIG. 1B.

The TFT is exposed through a hole formed in an organic passivation layer. The organic passivation layer is formed in a portion of an opening of the pixel and not on the TFT within the pixel area. An insulating material serving as an etch stopper is formed in a channel region of the TFT. A source electrode of the TFT and the pixel electrode PIX directly contact each other on a gate of the TFT or the gate line GL. Thus, a wide process margin to create the hole in the organic passivation layer is not needed. Hence, an aperture ratio of the pixel increases, and contact resistance deceases through an increase in contact area between the TFT and the pixel electrode PIX.

In this embodiment of the invention, a source-drain metal and a gate insulator GI are simultaneously patterned. This also simultaneously forms the channel region of the oxide semiconductor TFT and the common electrode COM to reduce the number of manufacturing processes of the display device. Thus, this embodiment of the invention may omit at least three photomask processes, compared to the related art.

The common electrode COM may receive the common voltage Vcom through a contact electrode GM. Thus, a deviation of the common voltage Vcom at the pixels throughout the entire screen of the display device can be reduced by decreasing contract resistance. The contact electrode GM can be formed of the same metal as the gate of the TFT and the gate line GL and is positioned on the same layer as the gate metal pattern. The common electrode COM may include a metalized oxide semiconductor and contact the contact electrode GM through a contact hole through a passivation layer.

FIGS. 2A to 7B illustrate a method for manufacturing the pixel shown in FIGS. 1A and 1B. More specifically, FIGS. 2A to 7B show cross sections of the TFT, an opening PIXEL, and a common electrode contact part CNT taken along lines I-I' and II-II' of FIG. 1A. The common electrode contact part CNT may be formed outside a pixel area of a display panel, i.e., in an outer area of the display panel.

A first photomask process is described with reference to FIGS. 2A and 2B.

Figure 2A:
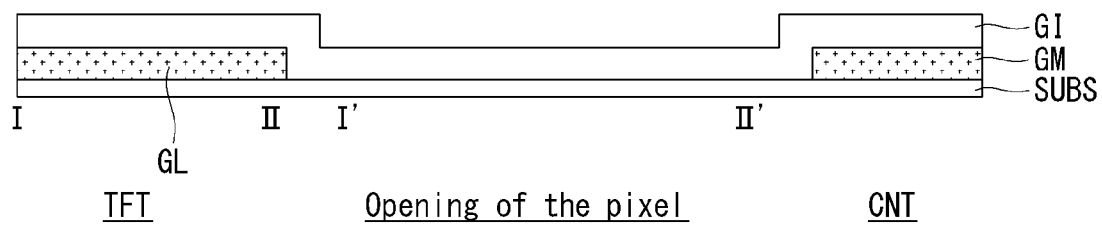
FIGS. 2A to 7B illustrate an exemplary method for manufacturing a pixel shown in FIG. 1.
Figure 2B:
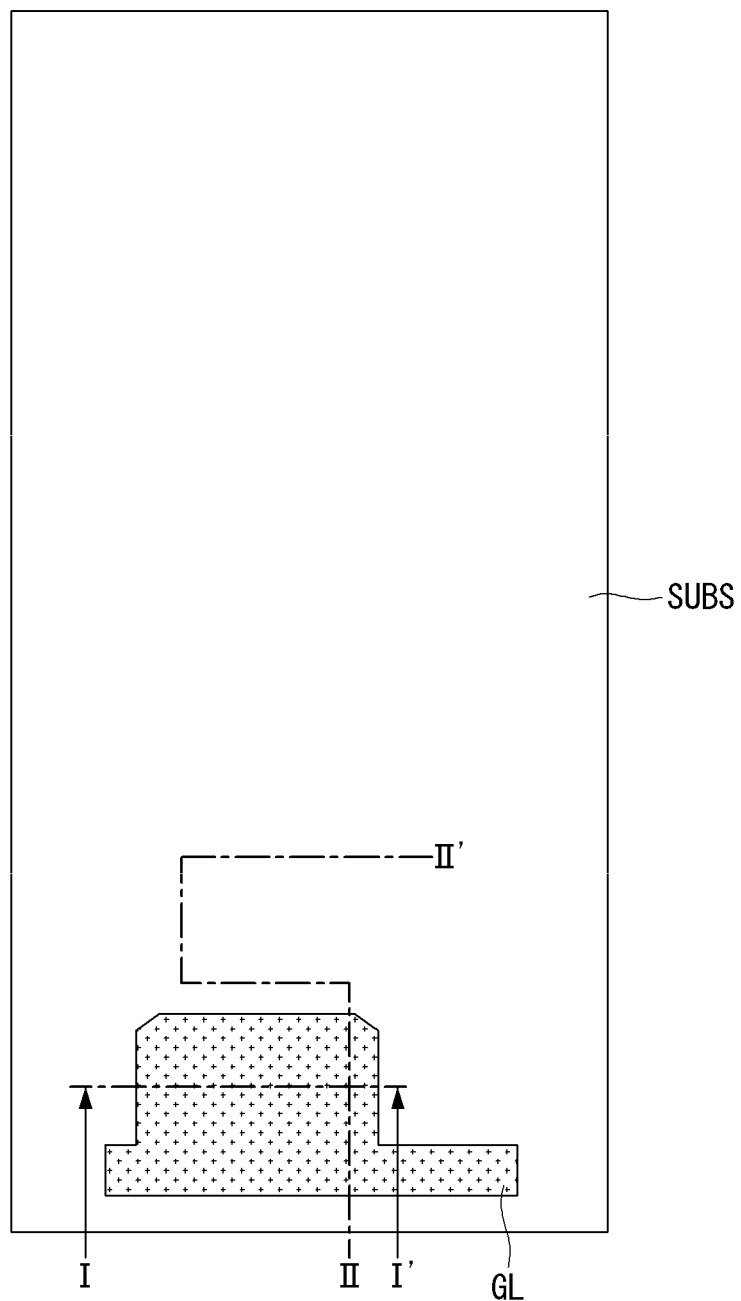

Referring to FIGS. 2A and 2B, a metal is deposited on a substrate SUBS and is partially etched by the first photomask process. As a result of the first photomask process, a gate metal pattern is formed on the substrate SUBS. In a subsequent etching process for etching a source-drain metal, the gate metal has to be selected as a metal that is not etched by an etchant used in the etching process. When the source-drain metal is formed of copper (Cu), the gate metal is a metal, for example, molybdenum (Mo) or molybdenum titanium (MoTi), which is not etched by a Cu etchant. The gate metal pattern includes the gate of the TFT, the gate line GL, and the contact electrode GM. The gate of the TFT may be integrated with the gate line GL.

Subsequently, a gate insulator GI is deposited and covers the gate metal pattern and the contact electrode GM. The gate insulator GI may be formed of silicon oxide (SiOx). The contact electrode GM contacts the common electrode COM and supplies the common voltage Vcom to the common electrode COM.

The TFT according to the embodiment of the invention is formed on the gate line GL and contact electrode GM. A contact portion between the source of the TFT and the pixel electrode PIX is positioned on the gate of the TFT or the gate line GL. Thus, the aperture ratio of the pixel according to the embodiment of the invention increases compared to the related art (refer to the left side of FIG. 9), in which a contact portion between the source of the TFT and the pixel electrode is separated from the gate line GL.

A second photomask process is described with reference to FIGS. 3A and 3B.

Figure 3A:
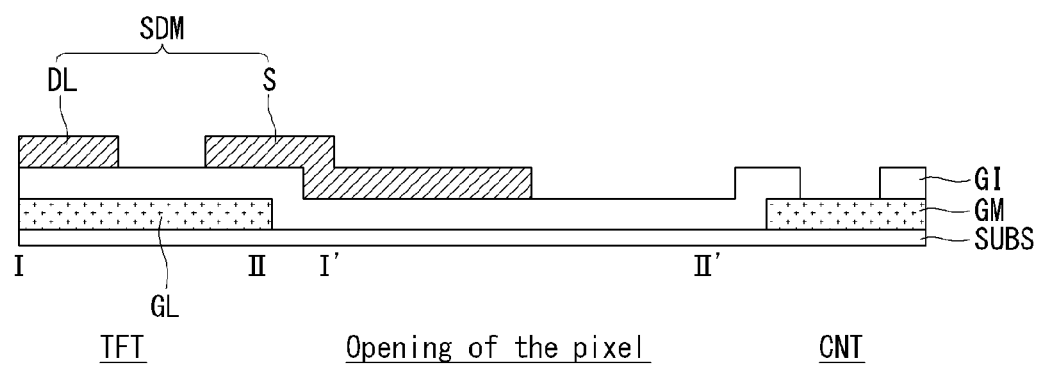
Figure 3B:
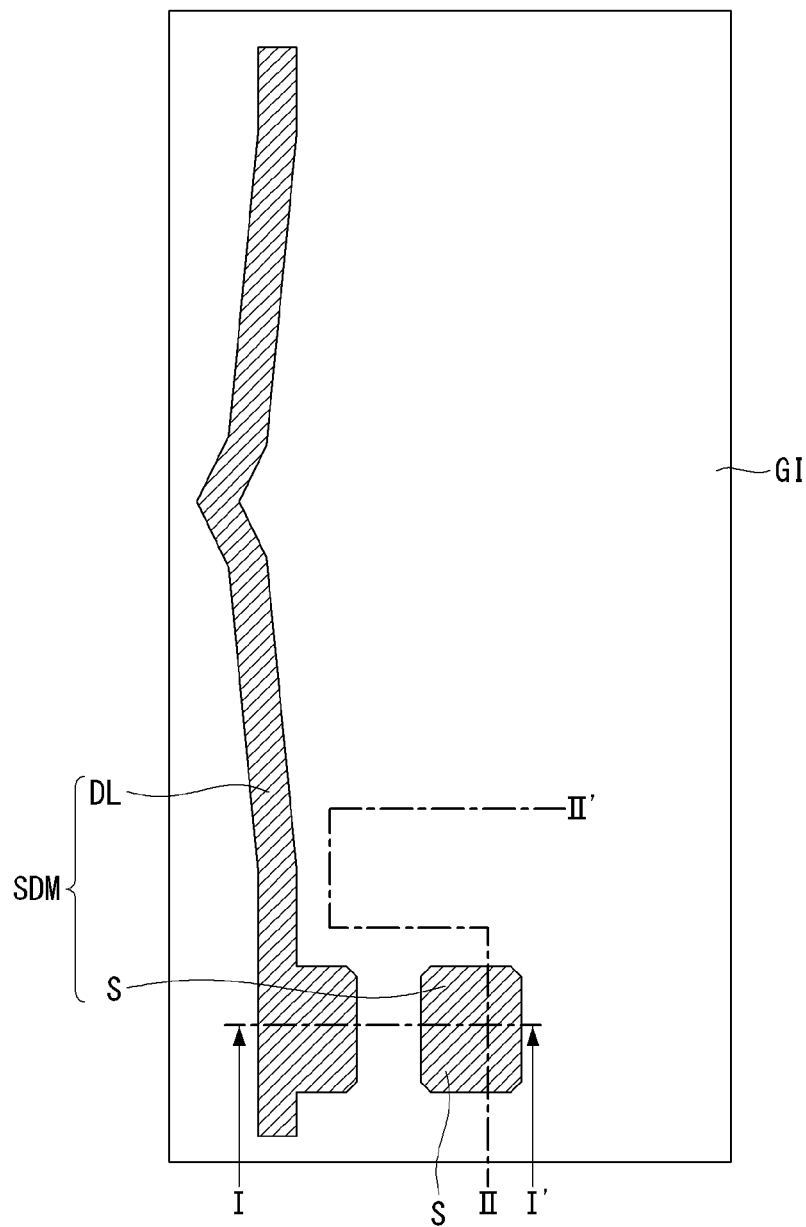

Referring to FIGS. 3A and 3B, a source-drain metal SDM is deposited on the gate insulator GI, and the second photomask process is performed to form a source-drain metal pattern and a gate insulator GI pattern. As shown in FIGS. 8A to 8E, the second photomask process includes forming a photoresist pattern having a varied height with 2 steps using a halftone mask. Thus, the source-drain metal and the gate insulator GI can be etched and patterned using one photomask. The second photomask process includes the step of wet etching the gate insulator GI and exposing the contact electrode GM. Then, the second photomask process includes ashing a photoresist pattern, etching the source-drain metal covering the region of the TFT where the channel will be, and exposing the gate insulator GI in the channel region of the TFT. The source-drain metal may be formed of copper (Cu). However, other materials may be used for the source-drain metal. The source-drain metal pattern includes the data line DL and the source S of the TFT. A drain of the TFT may be integrated with the data line DL.

In the embodiment the oxide semiconductor is formed after forming the source-drain metal pattern to prevent the oxide semiconductor from being damaged or degraded when the gate insulator GI or the source-drain metal pattern (DL, S) is wet etched.

FIGS. 8A to 8E are cross-sectional views showing, in stages, the second photomask process.

Figure 8A:
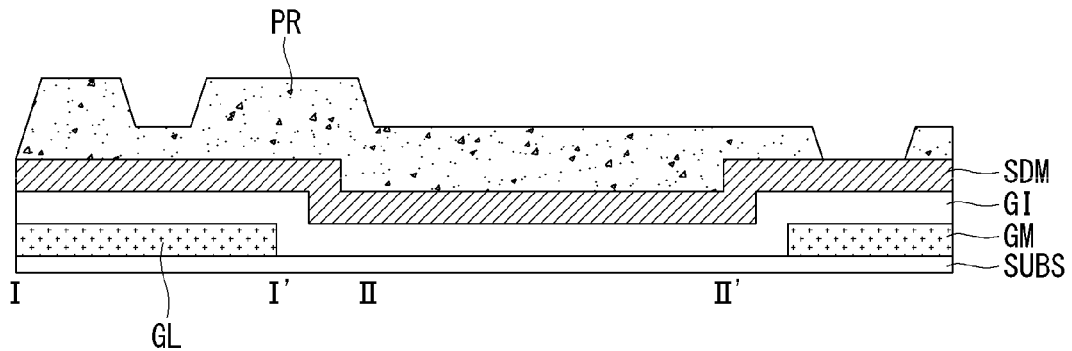
FIGS. 8A to 8E are cross-sectional views showing, in stages, a second photomask process.
Figure 8B:
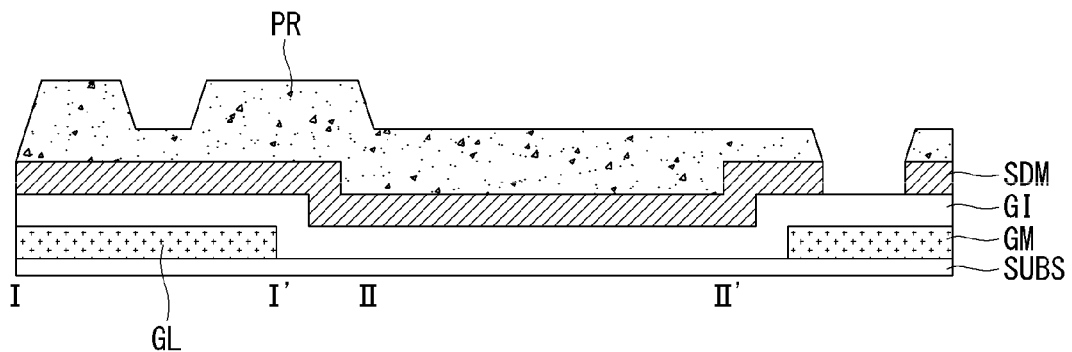
Figure 8C:
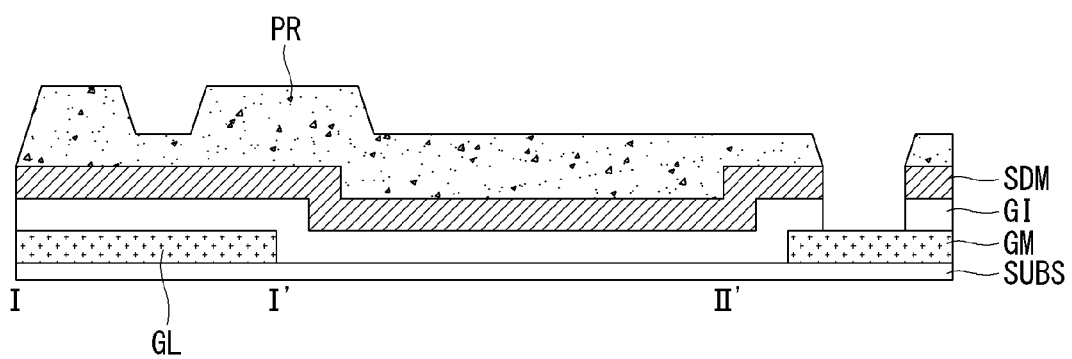

As shown in FIG. 8A, the gate insulator GI and a source-drain metal SDM are successively deposited on the substrate SUBS. The photoresist PR is applied on the source-drain metal SDM. Subsequently, a halftone mask is aligned on the photoresist PR and then the photoresist PR is exposed through the halftone mask. The exposed photoresist PR is then developed. As a result, as shown in FIG. 8B, photoresist PR on the contact electrode GM and the SDM is removed, and a thinner photoresist PR remains in the channel region of the TFT. Further, a thicker photoresist PR remains in other portions. Subsequently, as shown in FIG. 8C, wet etching is performed to remove a portion of the gate insulator GI and expose the contact electrode GM.

Figure 8D:
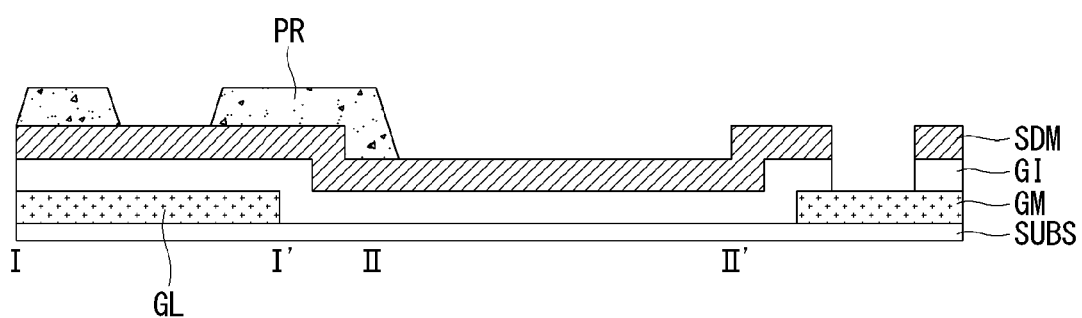
Figure 8E:
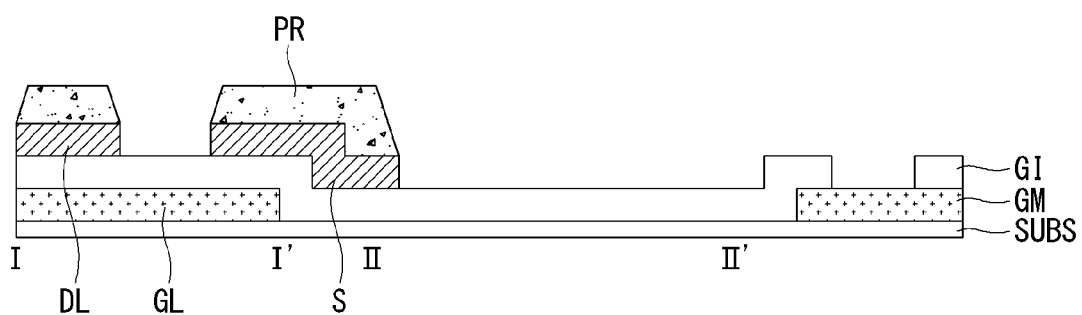

Subsequently, as shown in FIG. 8D, the photoresist PR is ashed to reduce the height of the photoresist PR and expose the source-drain metal SDM in the channel region of the TFT. Subsequently, as shown in FIG. 8E, wet etching is performed to pattern the source-drain metal SDM.

A third photomask process is described with reference to FIGS. 4A and 4B.

Figure 4A:
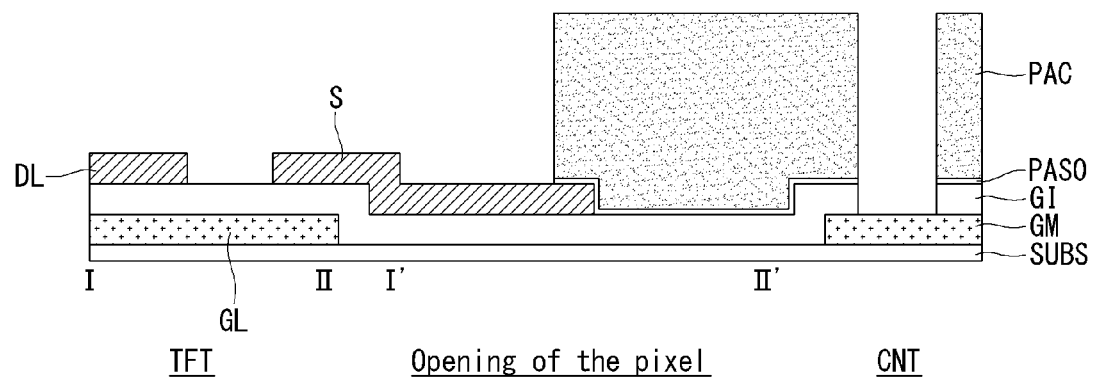
Figure 4B:
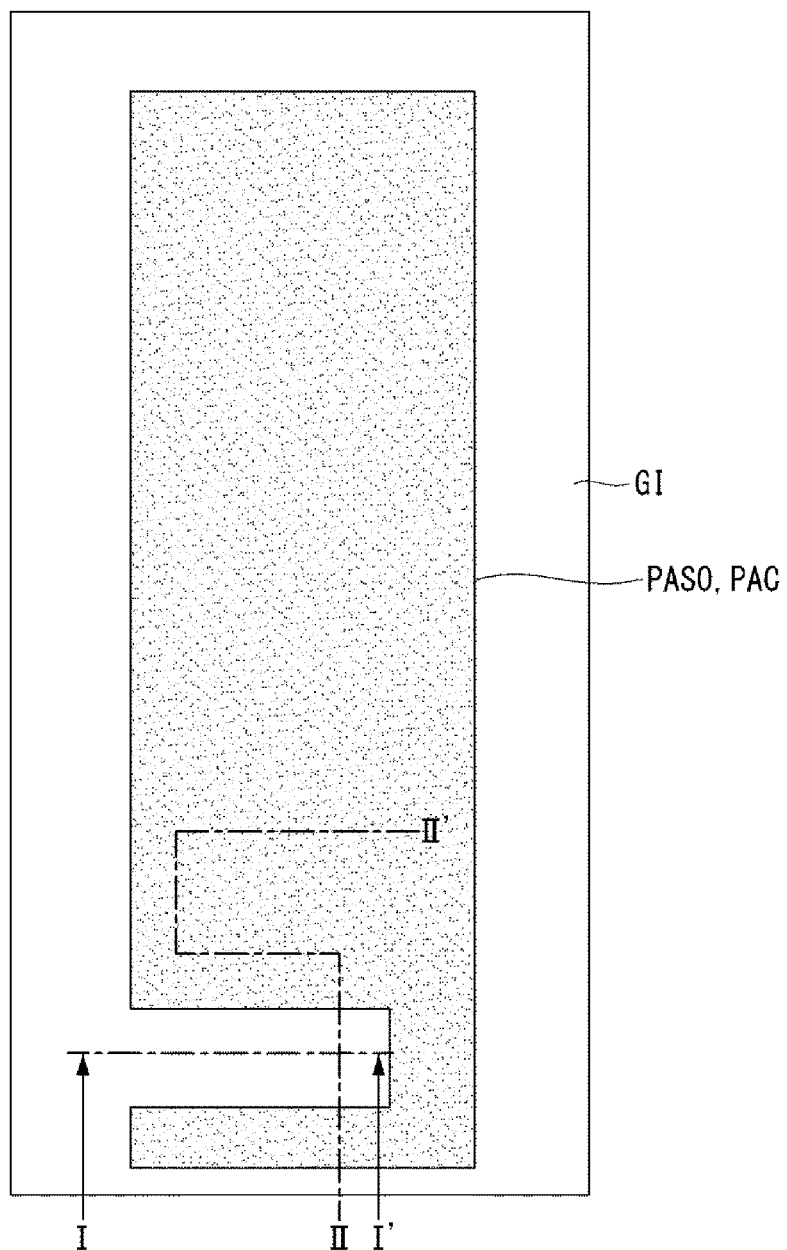

Referring to FIGS. 4A and 4B, the embodiment of the invention includes depositing a first inorganic passivation layer PAS0 and an organic passivation layer PAC on a portion of the source-drain metal pattern and the gate insulator GI. In the embodiment of the invention, the third photomask process partially etches the first inorganic passivation layer PAS0 and the organic passivation layer PAC to form a passivation layer pattern. The passivation layer pattern is only in an opening of the pixel not including the TFT, so that the TFT is exposed inside the pixel area. The first inorganic passivation layer PAS0 may be formed of silicon oxide (SiOx). The organic passivation layer PAC may be formed of photoacryl.

In the third photomask process, a photomask is aligned on the organic passivation layer PAC. An exposure process, a development process, and a dry etching process, are performed to pattern the first inorganic passivation layer PAS0 and the organic passivation layer PAC. As a result, the passivation layer pattern, in which the first inorganic passivation layer PAS0 and the organic passivation layer PAC are stacked, remains only in the opening of the pixel and not on the TFT and a peripheral area of the TFT.

A fourth photomask process is described with reference to FIGS. 5A to 5C.

Figure 5A:
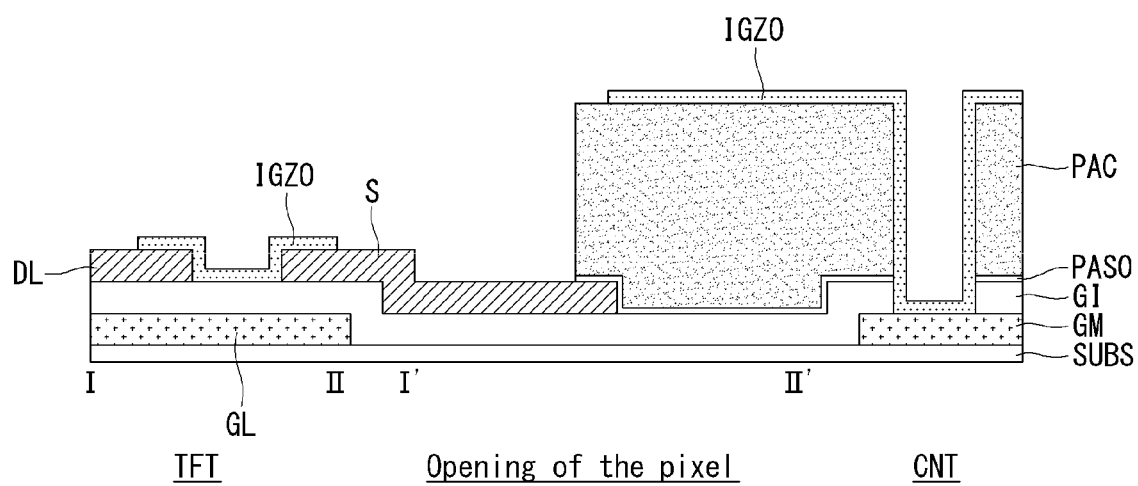
Figure 5B:
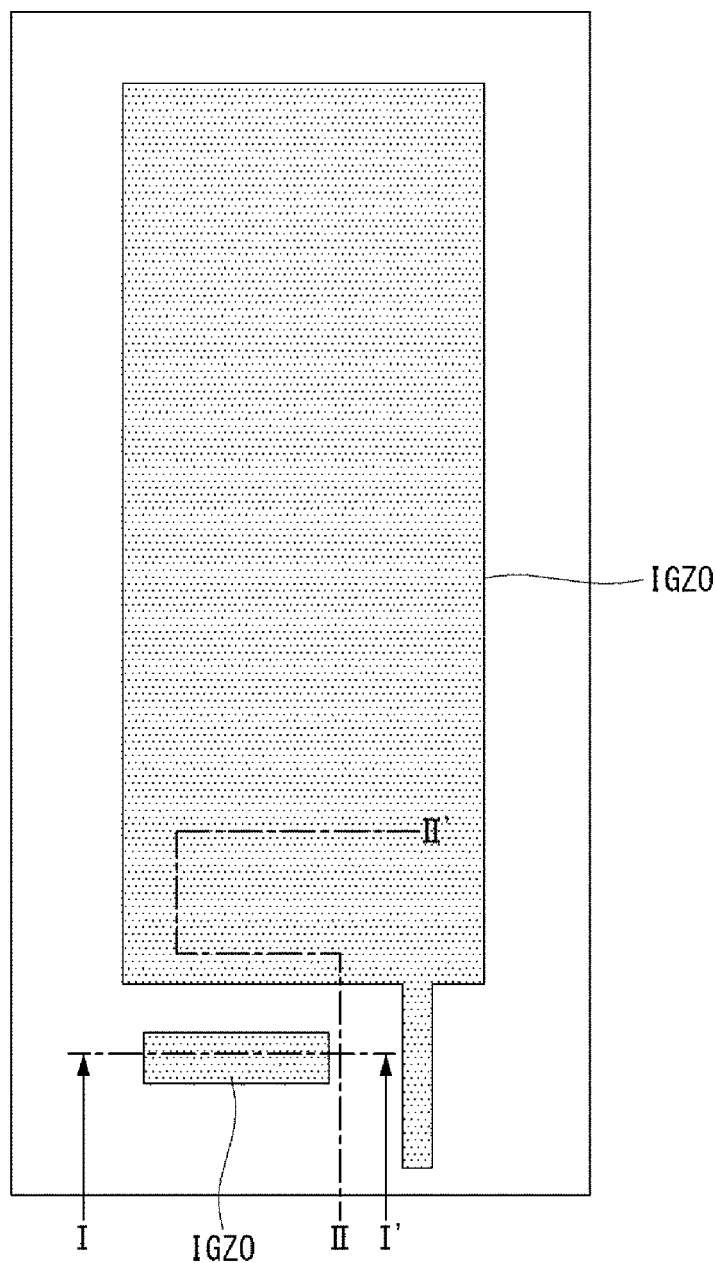
Figure 5C:
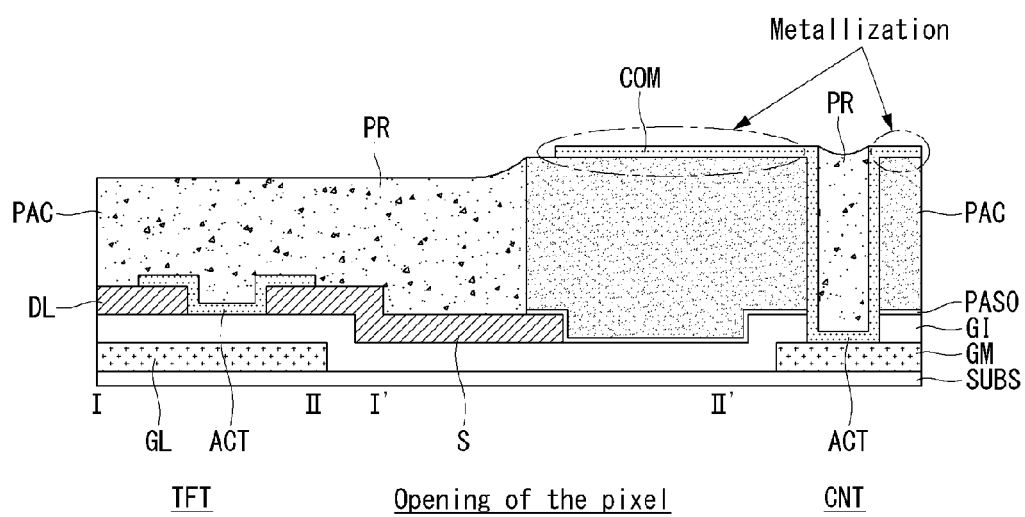

Referring to FIGS. 5A to 5C, in the embodiment of the invention, an oxide semiconductor is deposited on the entire surface of the substrate SUBS. The fourth photomask process is performed to partially etch the oxide semiconductor and to form an oxide semiconductor pattern ACT (refer to FIG. 5C). The oxide semiconductor may be Indium-Gallium-Zinc Oxide (IGZO). Other materials may be used. The oxide semiconductor pattern ACT includes a first oxide semiconductor pattern, which is formed in the channel region between the source S and the drain of the TFT so as to contact the source S and the drain of the TFT, and a second oxide semiconductor pattern formed in the opening of the pixel. The first oxide semiconductor pattern formed in the channel region of the TFT directly contacts the data line DL and the drain and the source S of the TFT. The oxide semiconductor (IGZO), as deposited, is a nonconductor having a high resistance. However, the oxide semiconductor (IGZO) is changed to the oxide semiconductor pattern ACT of the TFT and the common electrode COM of the pixel through a plasma processing and a thermal process, which is described below.

Conductive characteristics of the oxide semiconductor (IGZO) vary depending on its oxygen content. In the embodiment of the invention, the same metal oxide semiconductor material as Indium-Gallium-Zinc Oxide (IGZO) used in a semiconductor layer has characteristics of a conductor or a nonconductor by properly adjusting the content of oxygen. When the oxygen content decreases, the metal oxide semiconductor material has the characteristics of a conductor because the metal properties increase. Plasma processing may be used to decrease the oxygen content. Namely, the plasma processing may be performed on the oxide semiconductor to remove oxygen contained in the oxide semiconductor. Hence, a resistance of the oxide semiconductor is reduced, and the oxide semiconductor may be metalized.

The plasma processing is a method for generating a plasma discharge in helium (He) gas, hydrogen ($H_2$) gas, or argon (Ar) gas. The metallization of the oxide semiconductor is performed in a contact hole filling (CHF) process and a fourth photomask process. The metallization of the oxide semiconductor may be performed in the contact hole filling (CHF) process and the fourth photomask process, or may be subsequently performed using an alternate process.

The contact hole filling (CHF) process includes applying a photoresist PR on the substrate SUBS, ashing the photoresist PR, and maintaining the photoresist PR pattern only in holes that pass through the passivation layer. As the result of the contact hole filling (CHF) process, as shown in FIG. 5C, the oxide semiconductor pattern ACT formed on the TFT and the oxide semiconductor pattern ACT formed on the contact electrode GM are covered by the photoresist PR. Subsequently, the substrate SUBS is configured through the plasma processing to a state where the photoresist PR remains only in the holes. As a result, as shown in FIG. 5C, the oxide semiconductor pattern ACT exposed on the passivation layer pattern PAC is metalized. A metalized portion of the oxide semiconductor pattern ACT serves as the common electrode COM, to which the common voltage Vcom is supplied through the contact electrode GM. Thus, the contact hole filling (CHF) process is a process for selectively metalizing the oxide semiconductor without a photomask process. As a result, the metalized portion of the oxide semiconductor COM has a resistance lower than the portion of the oxide semiconductor that is not metalized.

A fifth photomask process is described with reference to FIG. 6.

Figure 6:
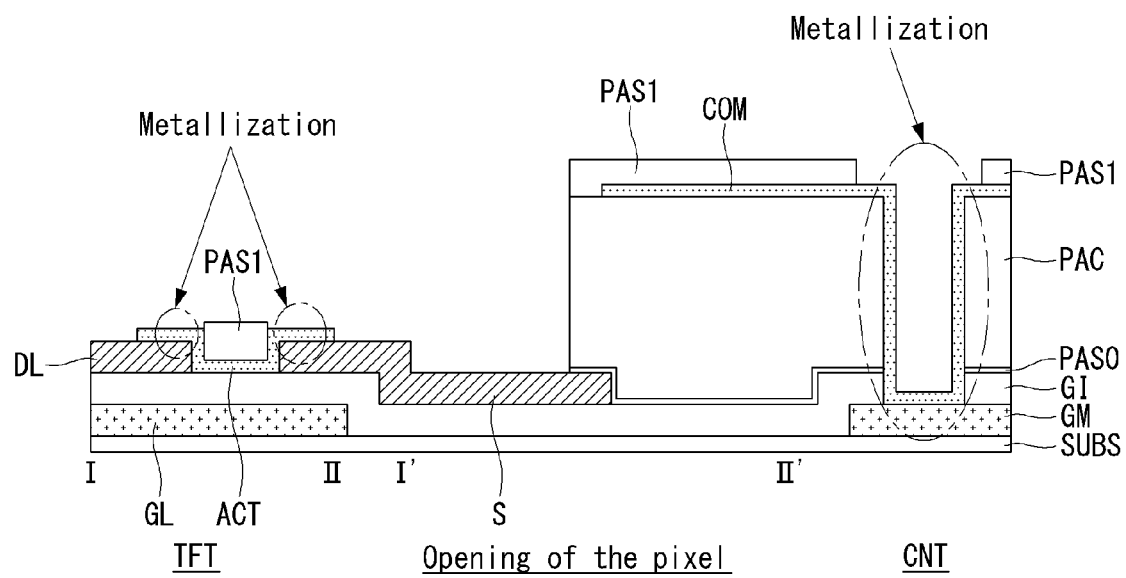

Referring to FIG. 6, in the embodiment of the invention, an inorganic insulator is deposited on the substrate SUBS and the fifth photomask process is performed to partially etch the inorganic insulator. A second inorganic insulator PAS1 covers the common electrode COM on the passivation layer pattern (PAC, PAS0) and the channel region of the TFT. The oxide semiconductor is exposed in source and drain contact areas, excluding the channel region from the TFT, and that formed in a contact hole on the contact electrode GM. A second plasma processing is then performed to metalize the exposed oxide semiconductor. As a result, a portion of the oxide semiconductor in the source and drain contact areas not covered has a resistance lower than the portion of the oxide semiconductor in the channel region between the source and drain contact areas. Also, the common electrode COM and the contact electrode GM are connected to a metalized oxide semiconductor with a resistance lower than the COM metalized oxide semiconductor.

The source and drain contact areas of the TFT are metalized, and the source and the drain of the TFT and an ohmic contact may be formed. Because the channel region of the TFT is protected by an inorganic insulator pattern PAS1 serving as the etch stopper, the channel region is not metalized. The source S of the TFT directly contacts the metalized oxide semiconductor pattern. The drain of the TFT includes the metalized oxide semiconductor pattern that directly contacts the data line DL. Thus, the source and the drain of the TFT include the metalized oxide semiconductor pattern. The oxide semiconductor pattern ACT of the channel region of the TFT covered by the second inorganic insulator PAS1 is an active layer forming a channel of the TFT with an oxygen concentration of the oxide semiconductor pattern ACT adjusted using a thermal process.

A sixth photomask process is described with reference to FIGS. 7A and 7B.

Figure 7A:
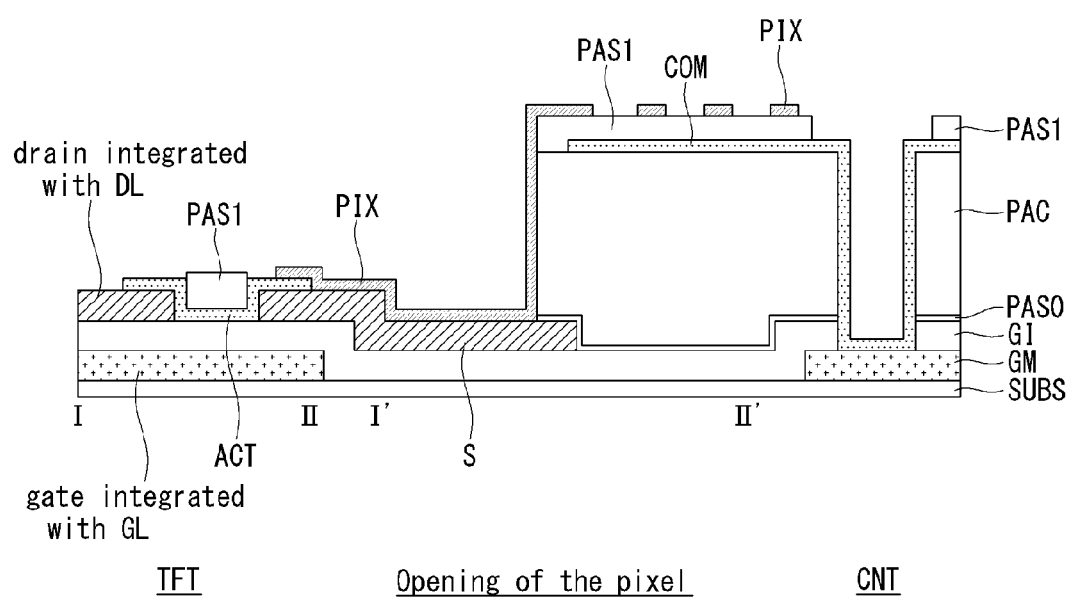
Figure 7B:
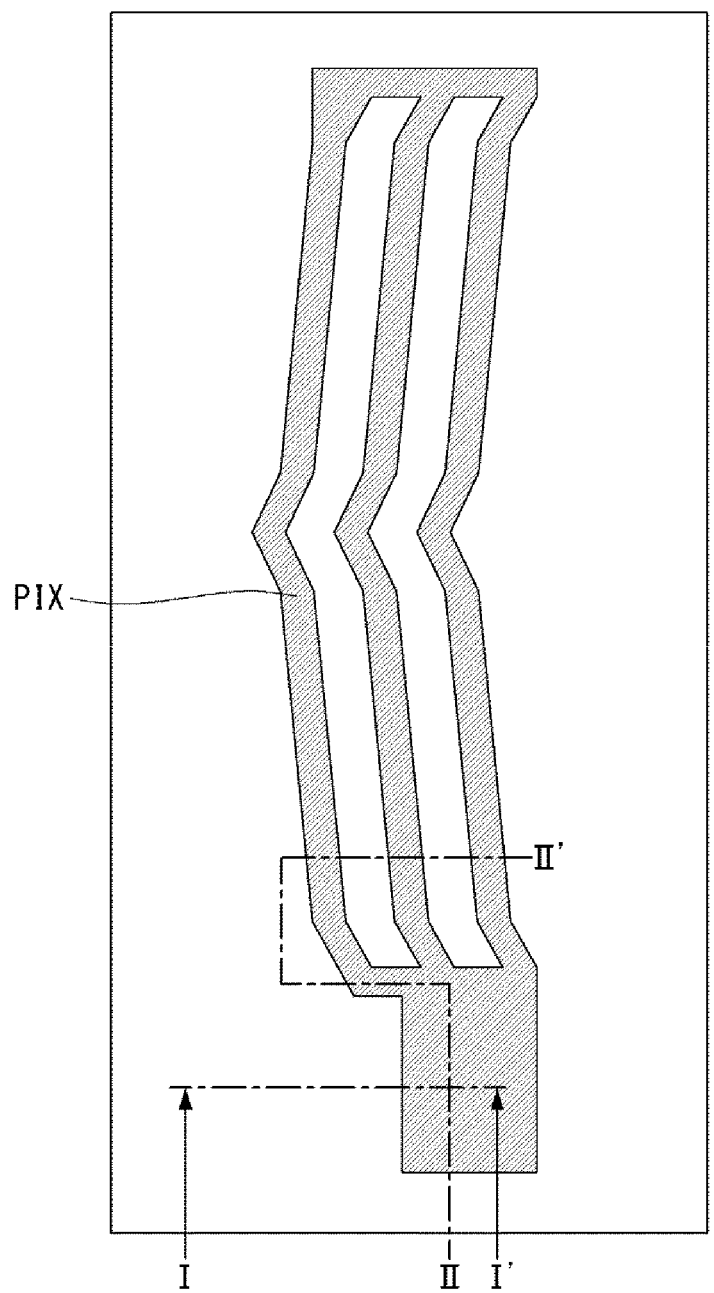

Referring to FIGS. 7A and 7B, in the embodiment of the invention a transparent electrode material is deposited on the substrate SUBS and the sixth photomask process is performed to partially etch the transparent electrode material. Hence, the pixel electrode PIX is formed. The transparent electrode material may be indium tin oxide (ITO). The pixel electrode PIX is connected to the source S of the TFT and is formed in the opening of the pixel, thereby allowing an electric field to be formed with the common electrode COM. In the opening of the pixel, the pixel electrode PIX overlaps the common electrode COM with the second inorganic insulator PAS1 interposed therebetween. The pixel electrode PIX directly contacts the source S of the TFT. A contact portion between the pixel electrode PIX and the source S of the TFT overlaps the gate line GL, and thus, the aperture ratio of the pixel is not reduced.

If a separate third metal is formed on the source-drain metal pattern and under the pixel electrode PIX, a photomask process for partially etching the third metal may be added before the sixth photomask process.

Figure 9:
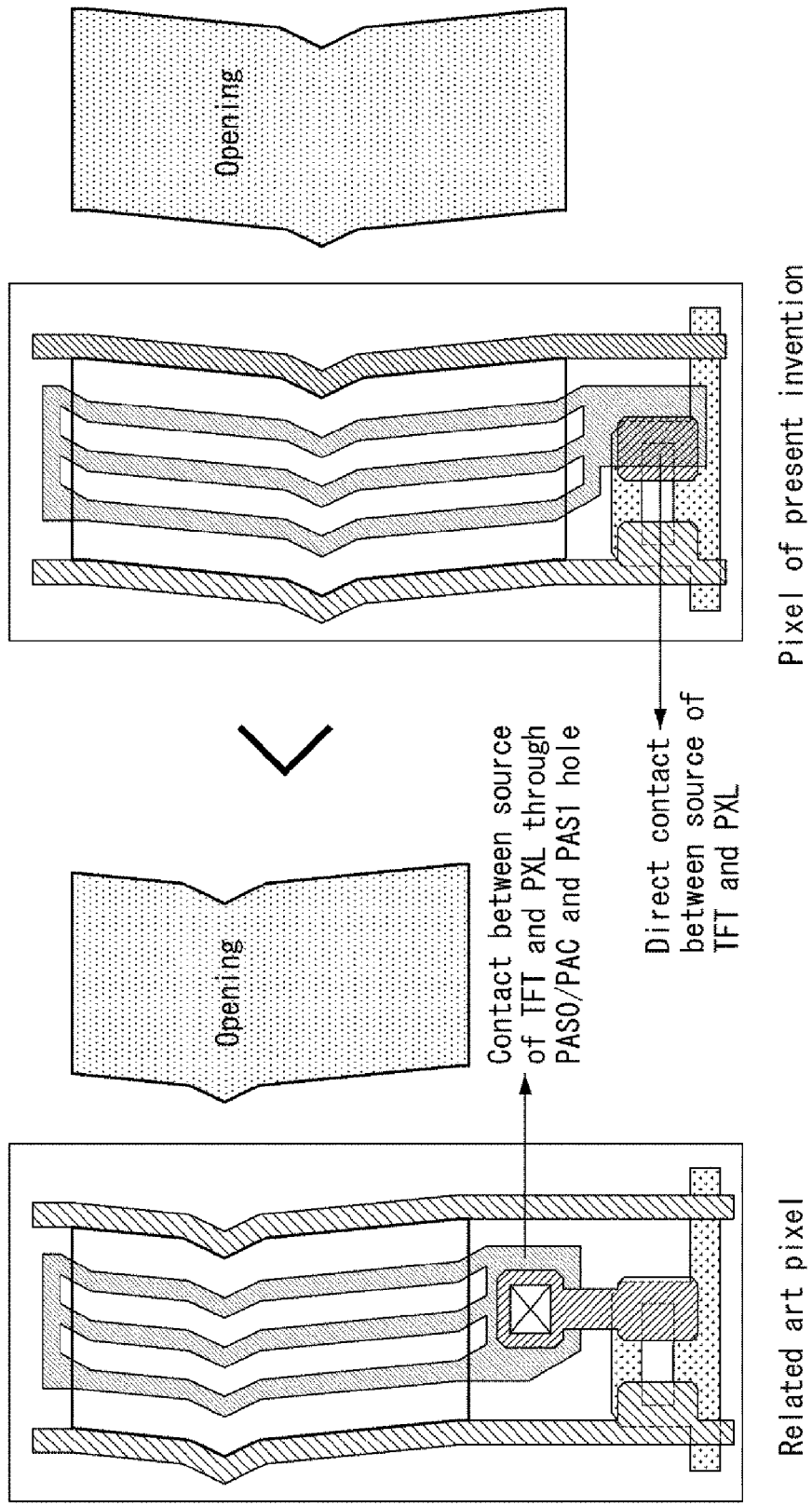
FIG. 9 illustrates an improvement of an aperture ratio of a display device according to an exemplary embodiment of the invention.

FIG. 9 shows an improvement of the aperture ratio of the display device according to the embodiment of the invention as opposed to the related art.

Referring to FIG. 9, a related art pixel shown at the left side of FIG. 9 is a comparative example where the source of the TFT and the pixel electrode contact each other through a contact hole passing through inorganic passivation layers and an organic passivation layer. In the related art pixel, because the size of the contact hole contacting the source of the TFT and the pixel electrode is large, the size of an opening of the related art pixel is smaller. On the contrary, in the pixel according to the embodiment of the invention shown at the right side of FIG. 9, the source of the TFT and the pixel electrode PXL directly contact each other in a portion not having the passivation layer, and a contact portion between the source of the TFT and the pixel electrode PXL is positioned on the gate line GL. Thus, the size of the opening of the pixel according to the embodiment of the invention can increase compared to the related art pixel.

It is possible that a position of the pixel electrode PXL and a position of the common electrode COM may be reversed. In this instance, the common electrode COM is positioned on the pixel electrode PXL.

The display device according to the embodiment of the invention may be applied to any display device, in which a TFT is formed at each pixel. For example, a TFT array substrate according to the embodiment of the invention may be applied to a liquid crystal display of an in-plane switching (IPS) mode or a fringe field switching (FFS) mode. Further, in the display device according to the embodiment of the invention, if the pixel electrode PXL is connected to an anode of an organic light emitting diode (OLED), the pixel electrode PXL may be applied to an OLED display.

As described above, the embodiment of the invention patterns the source-drain metal and the gate insulator in one photomask process, simultaneously forms the oxide semiconductor pattern of the TFT and the common electrode, and simultaneously forms the inorganic passivation layer and the etch stopper, thereby reducing the number of manufacturing processes and mask steps. Further, in the embodiment of the invention, the source of the TFT and the pixel electrode overlapping the gate line or the gate of the TFT are directly contacted, thereby increasing the aperture ratio.

Although embodiments have been described with reference to a number of illustrative embodiments thereof, it should be understood that numerous other modifications and embodiments can be devised by those skilled in the art that will fall within the scope of the principles of this disclosure. More particularly, variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
   a thin film transistor (TFT) including a gate integrated with a gate line, a first layer over the gate line, a drain electrode integrated with a data line, and a source electrode connected to a pixel electrode; and
   a passivation layer in an opening of a pixel,
   wherein the first layer includes an oxide semiconductor over the gate in a channel region of the TFT and a first metalized form of the oxide semiconductor over the source electrode and the drain electrode of the TFT,
   wherein the pixel electrode directly contacts the source electrode and the first metalized form of the oxide semiconductor,
   wherein the source electrode directly contacts the first metalized form of the oxide semiconductor.

2. The display device of claim 1,
   wherein each of the source electrode and the drain electrode of the TFT includes a portion of the first metalized form of the oxide semiconductor.

3. The display device of claim 1, further comprising:
   a common electrode configured to receive a common voltage; and
   a contact electrode in a same layer as the gate of the TFT and connected to the common electrode,
   wherein the common electrode includes a second metalized form of the oxide semiconductor and contacts the contact electrode through a contact hole in the passivation layer.

4. The display device of claim 1, wherein the first layer contacts the source electrode and the drain electrode of the TFT,
wherein the display device further includes a common electrode comprising a second metalized form of the oxide semiconductor, the common electrode contacting a contact electrode and configured to receive a common voltage;
wherein an insulator covers a portion of the first layer and a portion of the common electrode,
wherein the pixel electrode overlaps the common electrode over the insulator.

5. The display device of claim 4, wherein the first metalized form of the oxide semiconductor has a resistance that is lower than that of the oxide semiconductor, and
wherein the portion of the first layer covered by the insulator is the oxide semiconductor.

6. The display device of claim 5, wherein the first metalized form of the oxide semiconductor contacts the drain electrode of the TFT, and
wherein a portion of the common electrode not covered by the insulator contacts the contact electrode.

7. A display device comprising:
a gate line, a gate of a thin film transistor (TFT) integrated with the gate line, and a contact electrode in a first metallization layer;
a gate insulator covering the gate of the TFT, the gate line, and a portion of the contact electrode;
a data line, a drain electrode of the TFT integrated with the data line, and a source electrode of the TFT, on the gate insulator, in a second metallization layer;
a passivation layer including a first inorganic passivation layer on a portion of the second metallization layer and the gate insulator, and an organic passivation layer on the first inorganic passivation layer, the passivation layer in an opening of a pixel so that the TFT is exposed inside the pixel;
a first layer including an oxide semiconductor in a channel region of the TFT and a first metalized form of the oxide semiconductor contacting the source electrode and the drain electrode of the TFT;
a common electrode comprising a second metalized form of the oxide semiconductor contacting the contact electrode;
a second inorganic insulator covering a portion of the first layer and a portion of the common electrode; and
a pixel electrode overlapping the common electrode over the second inorganic insulator,
wherein the pixel electrode directly contacts the source electrode and the first metalized form of the oxide semiconductor,
wherein the source electrode directly contacts the first metalized form of the oxide semiconductor.

8. The display device of claim 7, wherein the first metalized form of the oxide semiconductor has a resistance that is lower than that of the oxide semiconductor, and
wherein a portion of the common electrode not covered by the second inorganic insulator has a resistance that is lower than that of the portion of the second form of the metalized oxide semiconductor covered by the second inorganic insulator.

9. The display device of claim 8, wherein a portion of the common electrode not covered by the second inorganic insulator contacts the contact electrode and is configured to receive a common voltage through the contact electrode.

10. The display device of claim 1, wherein the pixel electrode directly contacts the source electrode and the first metalized form of the oxide semiconductor at a contact area that overlaps a portion of the gate line of the TFT.

11. The display device of claim 7, wherein the pixel electrode directly contacts the source electrode and the first metalized form of the oxide semiconductor at a contact area that overlaps the gate line of the TFT.

12. The display device of claim 4, wherein the first metalized form of the oxide semiconductor comprises a plasma-processed form of the oxide semiconductor.

13. The display device of claim 5, wherein the first metalized form of the oxide semiconductor has an oxygen content that is lower than that of the oxide semiconductor.

14. The display device of claim 1, wherein the first metalized form of the oxide semiconductor is between the pixel electrode and the source electrode.

15. The display device of claim 7, wherein the first metalized form of the oxide semiconductor is between the pixel electrode and the source electrode.

* * * * *